US010121964B2

(12) United States Patent
Tan et al.

(10) Patent No.: US 10,121,964 B2
(45) Date of Patent: Nov. 6, 2018

(54) INTEGRATED MAGNETIC RANDOM ACCESS MEMORY WITH LOGIC DEVICE

(71) Applicant: GLOBALFOUNDRIES Singapore Pte. Ltd., Singapore (SG)

(72) Inventors: Juan Boon Tan, Singapore (SG); Yi Jiang, Singapore (SG); Daxiang Wang, Singapore (SG); Fan Zhang, Singapore (SG); Francis Poh, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/862,180

(22) Filed: Sep. 23, 2015

(65) Prior Publication Data

US 2017/0084820 A1  Mar. 23, 2017

(51) Int. Cl.
*H01L 43/12* (2006.01)
*H01L 27/22* (2006.01)
*H01L 43/08* (2006.01)

(52) U.S. Cl.
CPC ............ *H01L 43/12* (2013.01); *H01L 27/228* (2013.01); *H01L 43/08* (2013.01)

(58) Field of Classification Search
CPC ......... H01L 43/02; H01L 43/08; H01L 43/12; H01L 27/222
See application file for complete search history.

(56) References Cited

U.S. PATENT DOCUMENTS

| 8,703,597 | B1* | 4/2014 | Sekar | H01L 23/481 |
| | | | | 257/E21.614 |
| 2002/0117737 | A1* | 8/2002 | Gates | H01L 21/7684 |
| | | | | 257/642 |
| 2005/0073878 | A1* | 4/2005 | Lin | G11C 11/15 |
| | | | | 365/158 |
| 2010/0193850 | A1* | 8/2010 | Asao | H01L 27/228 |
| | | | | 257/295 |
| 2013/0299952 | A1 | 11/2013 | Yamamoto et al. | |
| 2015/0340316 | A1* | 11/2015 | Or-Bach | G11O 5/025 |
| | | | | 257/2 |

* cited by examiner

*Primary Examiner* — Moazzam Hossain
*Assistant Examiner* — Farun Lu
(74) *Attorney, Agent, or Firm* — Horizon IP PTE Ltd.

(57) ABSTRACT

Integrating magnetic random access memory with logic is disclosed. The magnetic tunnel junction stack of a magnetic memory cell is disposed within a dielectric layer which serves as a via level of an interlevel dielectric layer with a metal level above the via level. An integration scheme for forming dual damascene structures for interconnects can be formed to logic and memory cells easily.

20 Claims, 17 Drawing Sheets

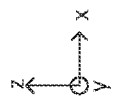
Fig. 2a

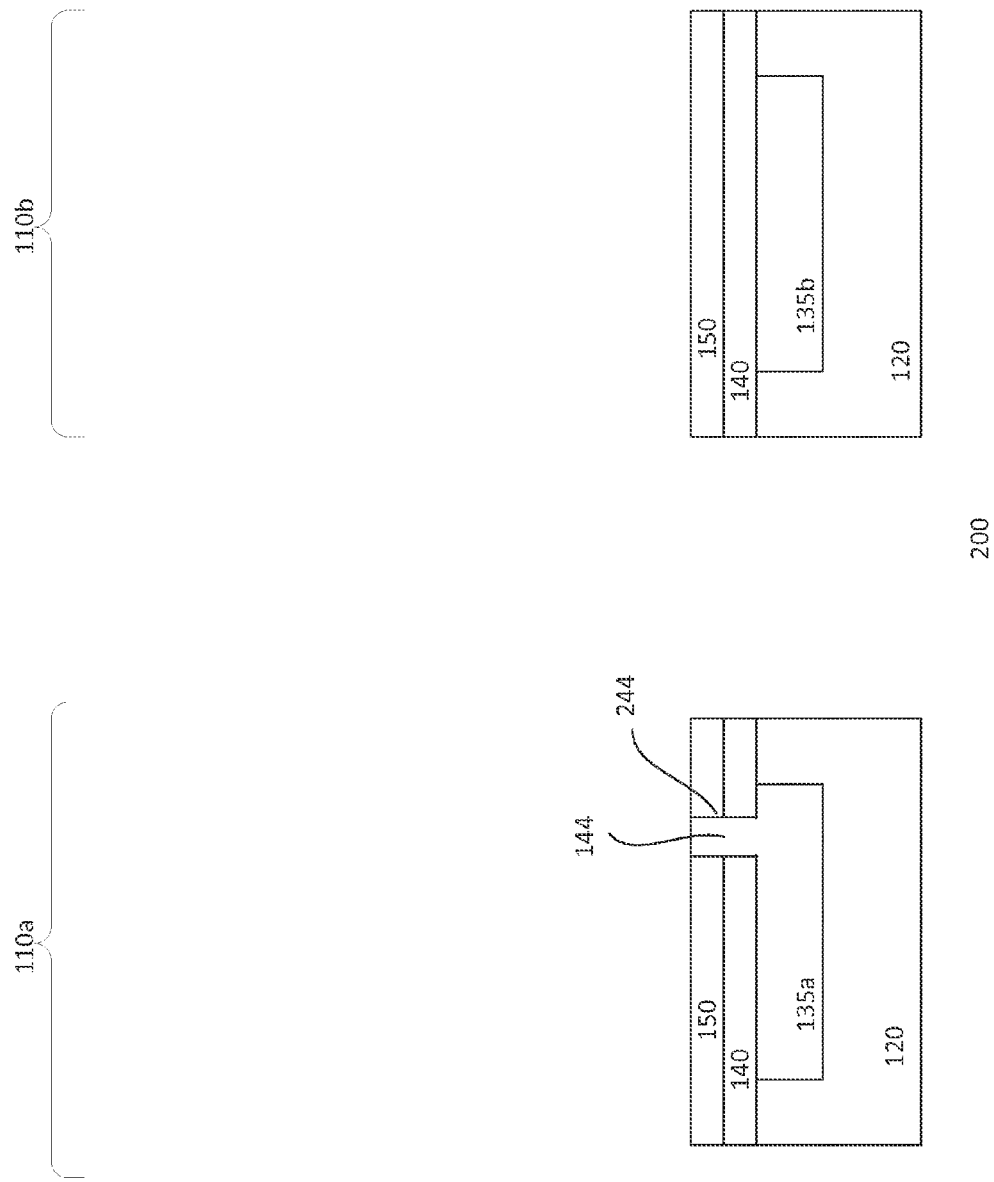

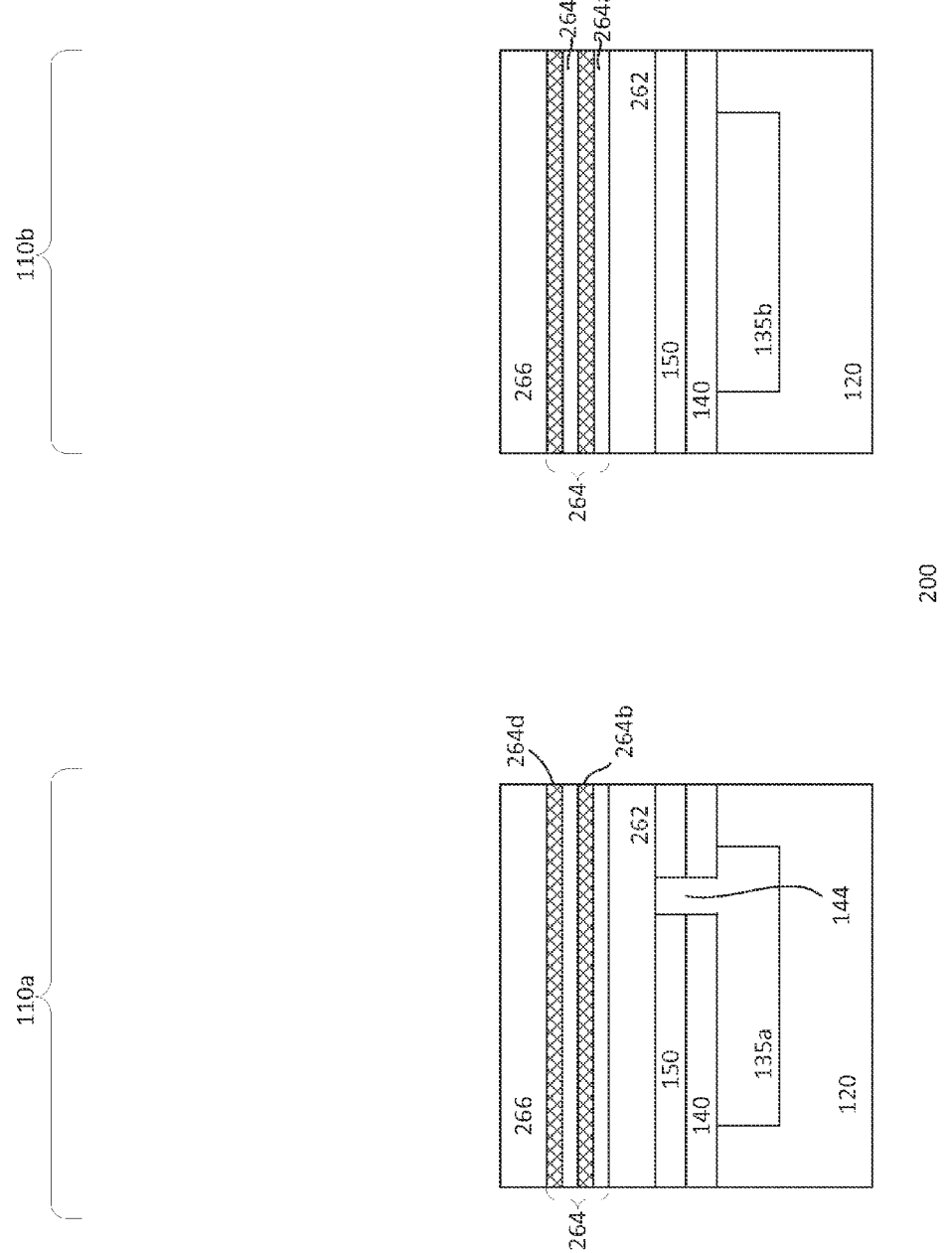

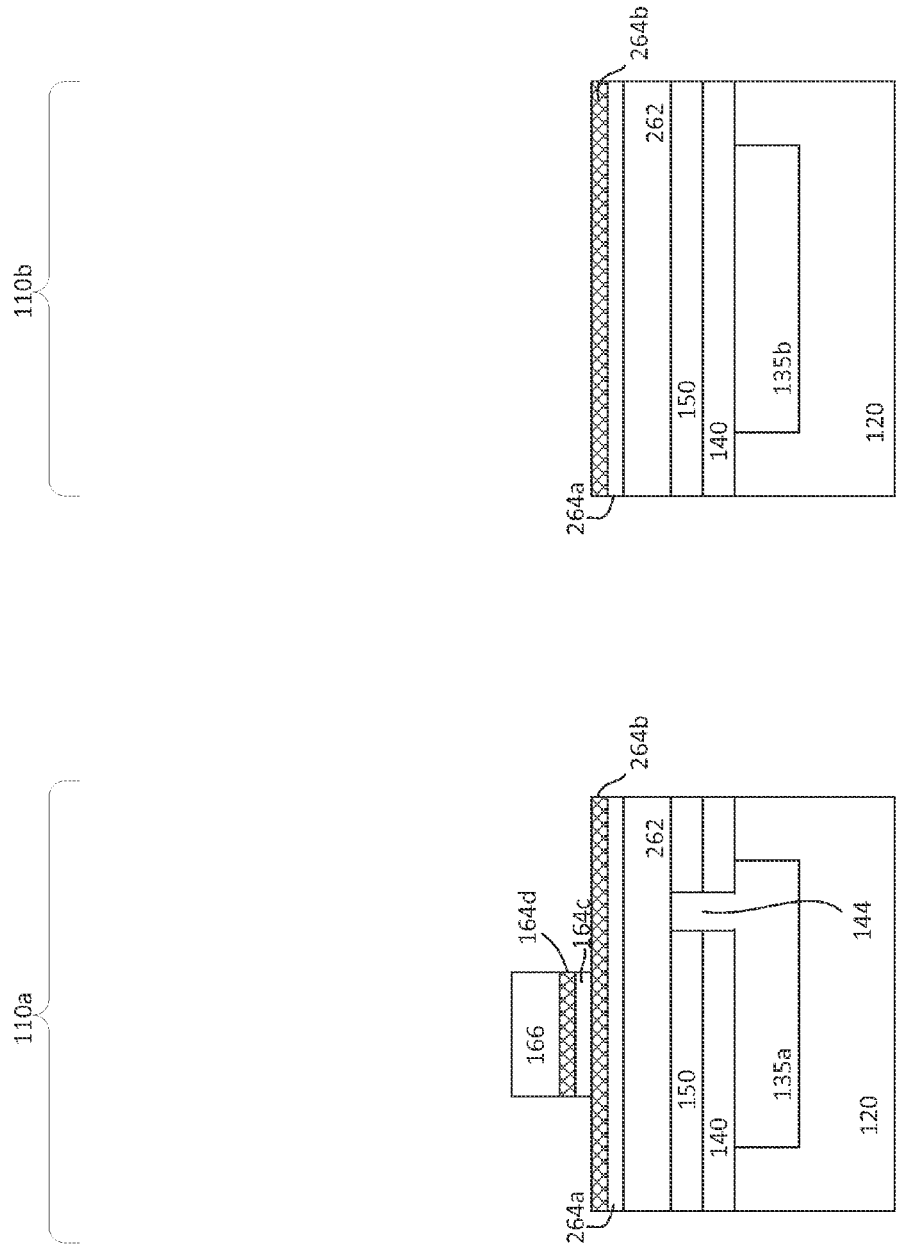

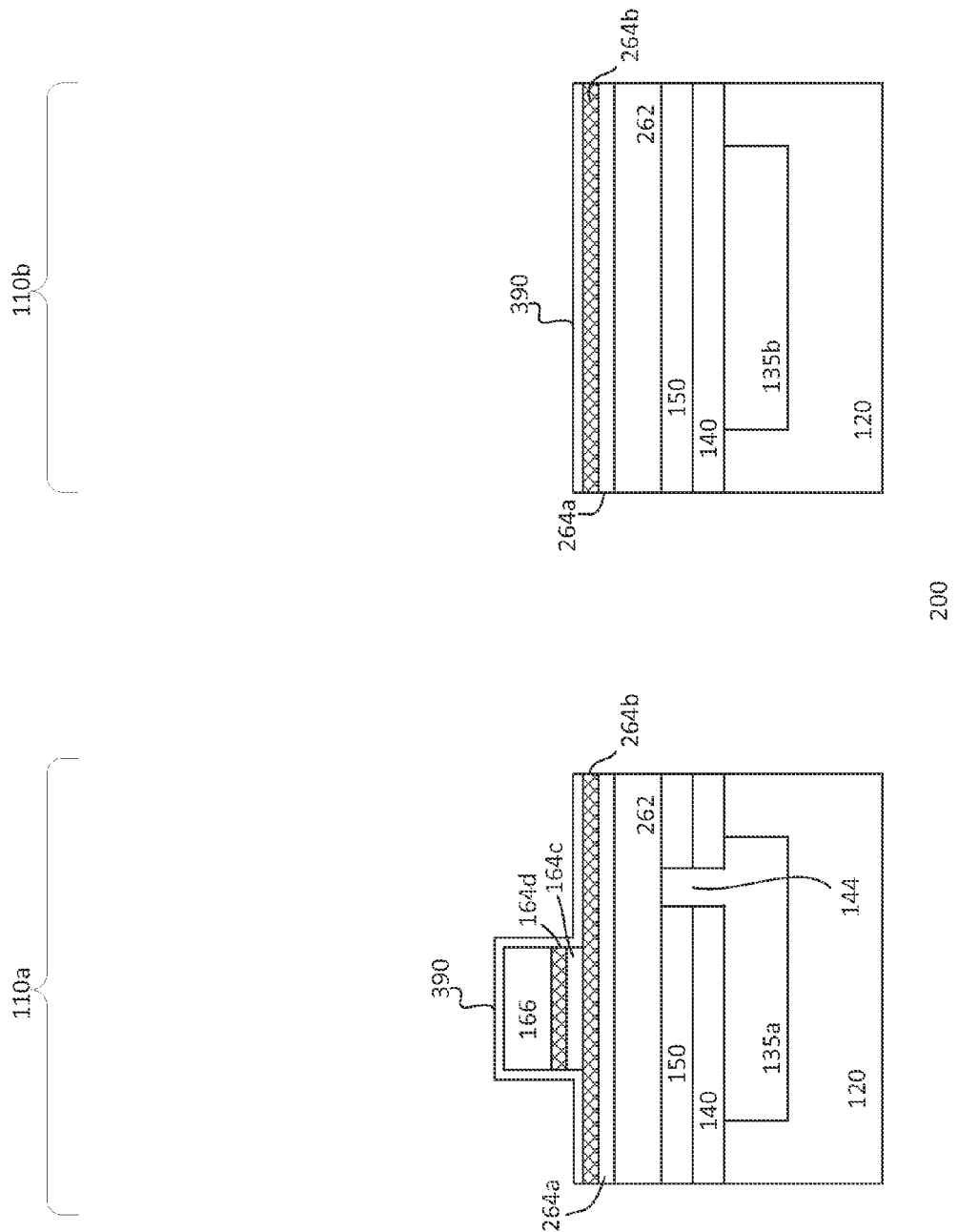

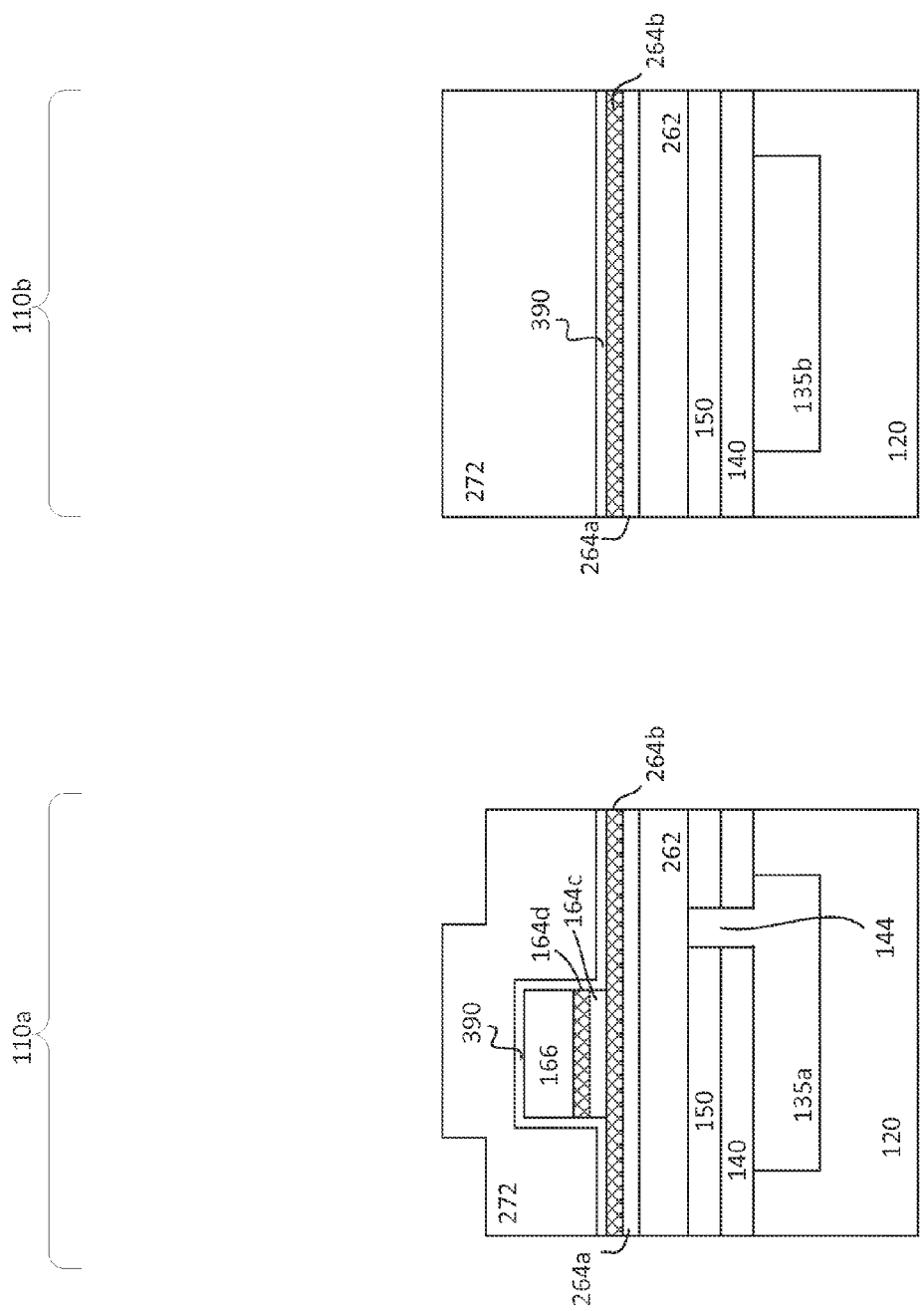

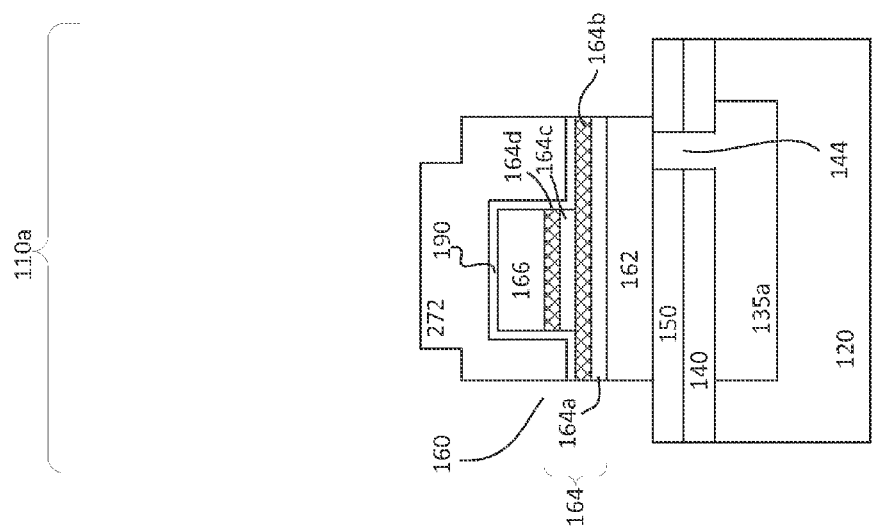
Fig. 2g

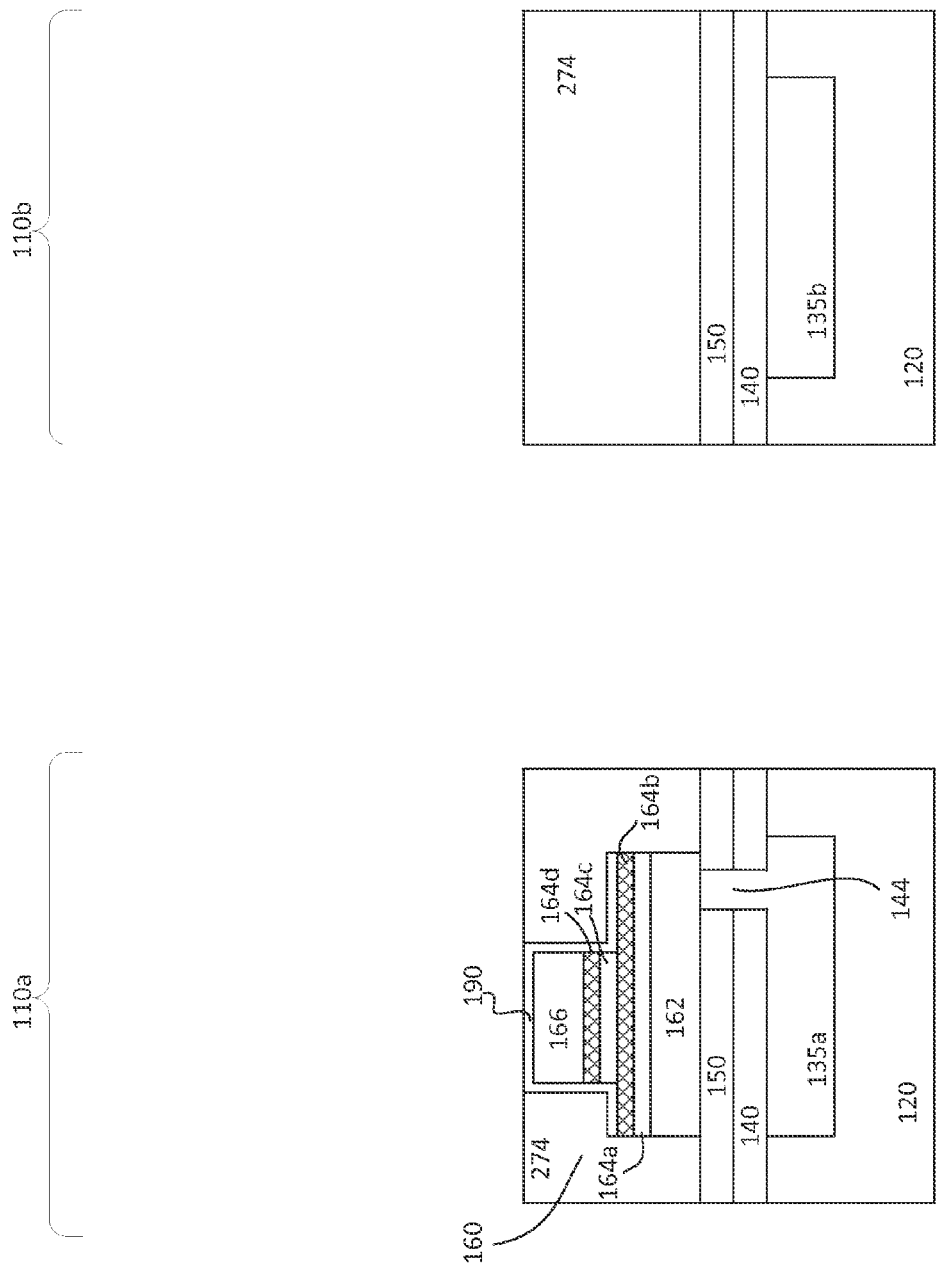

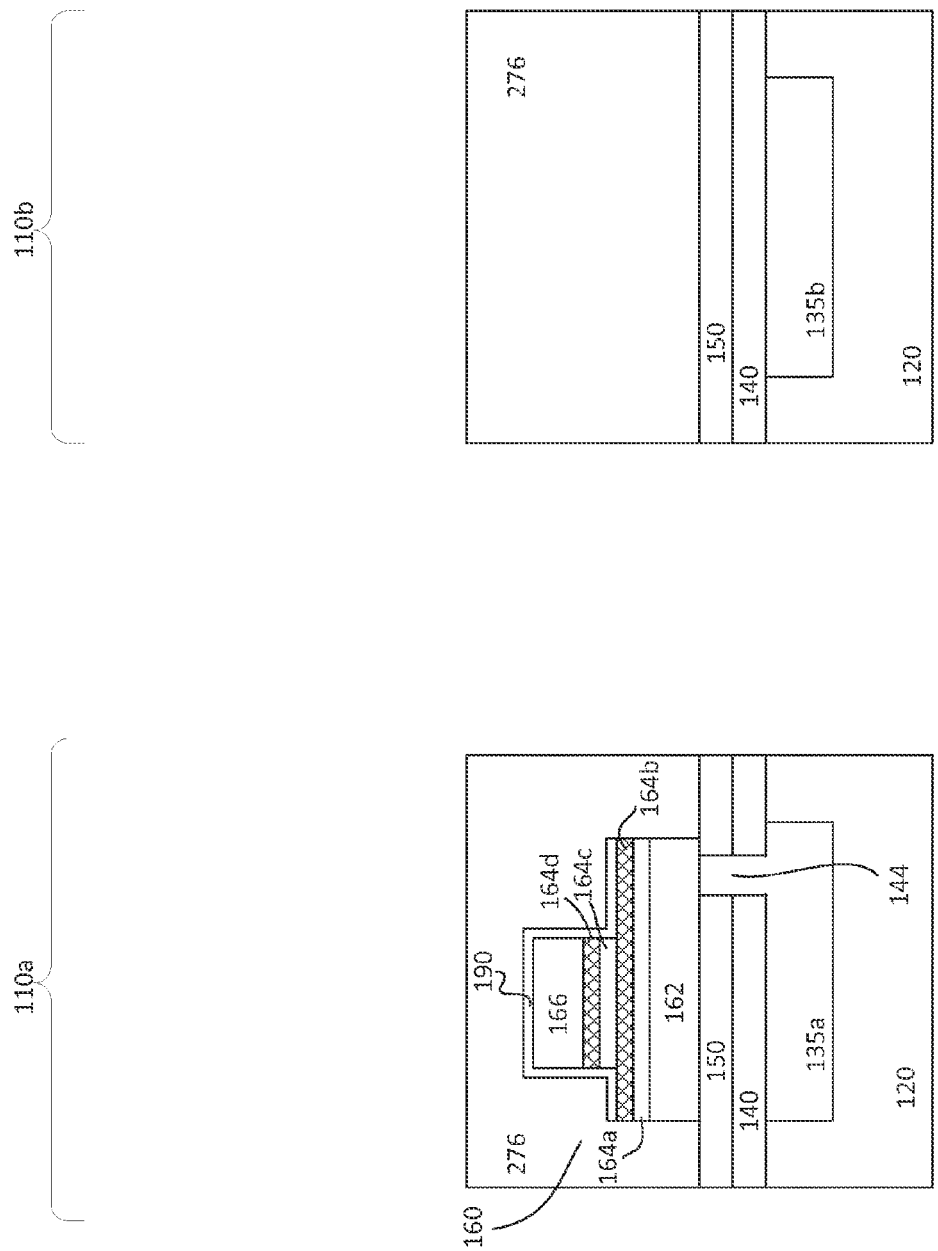

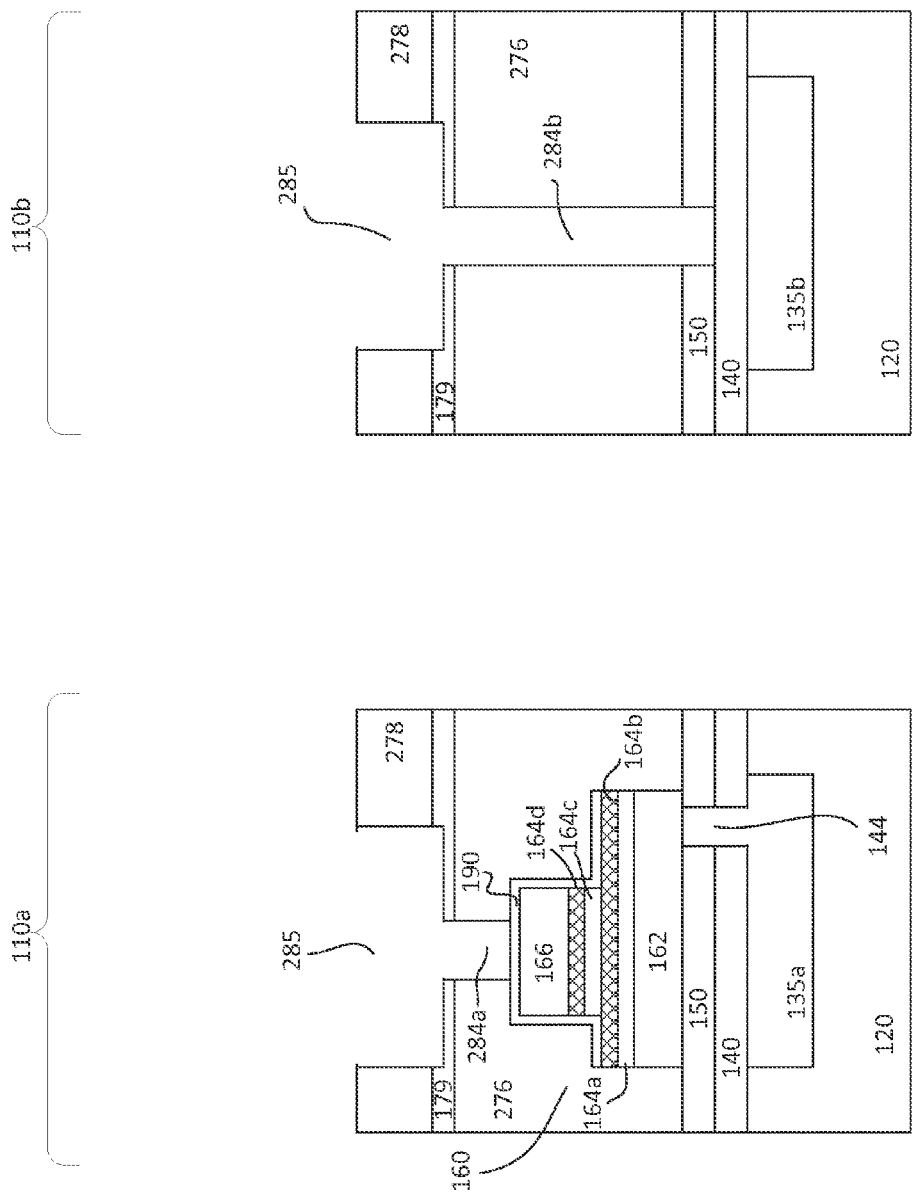

INTEGRATED MAGNETIC RANDOM ACCESS MEMORY WITH LOGIC DEVICE

CROSS-REFERENCE TO RELATED APPLICATIONS

This application cross-references to U.S. patent application Ser. No. 14/862,174, titled "INTEGRATED INDUCTOR AND MAGNETIC RANDOM ACCESS MEMORY DEVICE" that is concurrently filed and assigned to the same assignee as this application, which is herein incorporated by reference for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. MRAM cells are commonly integrated with various other logic gates and electronic components such as transistors, capacitors, metal wires, etc., in the development of memory devices. Accordingly, it is desirable that the process of manufacturing MRAM cell to be highly compatible with logic processing and it is also desirable to provide device structure and method that allow integration of MRAM with logic devices into a single chip or IC in a cost effective way.

SUMMARY

Embodiments of the present disclosure generally relate to semiconductor device and method for forming a semiconductor device. In one aspect, a method of forming a device is presented. The method includes providing a substrate defined with at least first and second regions. A first upper dielectric layer is provided over the first and second regions of the substrate. The first upper dielectric layer includes a first upper interconnect level with a plurality of metal lines in the first and second regions. A magnetic random access memory (MRAM) cell is formed. The MRAM cell is disposed over the first upper dielectric layer and is coupled to the metal line in the first upper interconnect level of the first region. A dielectric layer is provided over the first and second regions and covering the first upper dielectric layer. The dielectric layer includes a second upper interconnect level with a plurality of dual damascene interconnects in the first and second regions. The dual damascene interconnect in the first region is formed over and is coupled to the MRAM cell.

In another aspect, a device is disclosed. The device includes a substrate defined with at least first and second regions. A first upper dielectric layer is disposed over the first and second regions of the substrate. The first upper dielectric layer includes a first upper interconnect level with a plurality of metal lines in the first and second regions. A MRAM cell is disposed over the first upper dielectric layer and is coupled to the metal line in the first interconnect level of the first region. A dielectric layer is disposed over the first and second regions and covering the first upper dielectric layer. The dielectric layer includes a second upper interconnect level with a plurality of dual damascene interconnects in the first and second regions. The dual damascene interconnect in the first region is disposed over and is coupled to the MRAM cell.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments of the present disclosure generally relate to integration of memory device with logic device in an integrated circuit (IC). The memory device, for example, may be spin transfer torque magnetic random access memory (STT-MRAM) device. The memory device includes memory cell having MTJ element. Other suitable types of memory devices may also be useful. Such memory device together with logic components can be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1A:
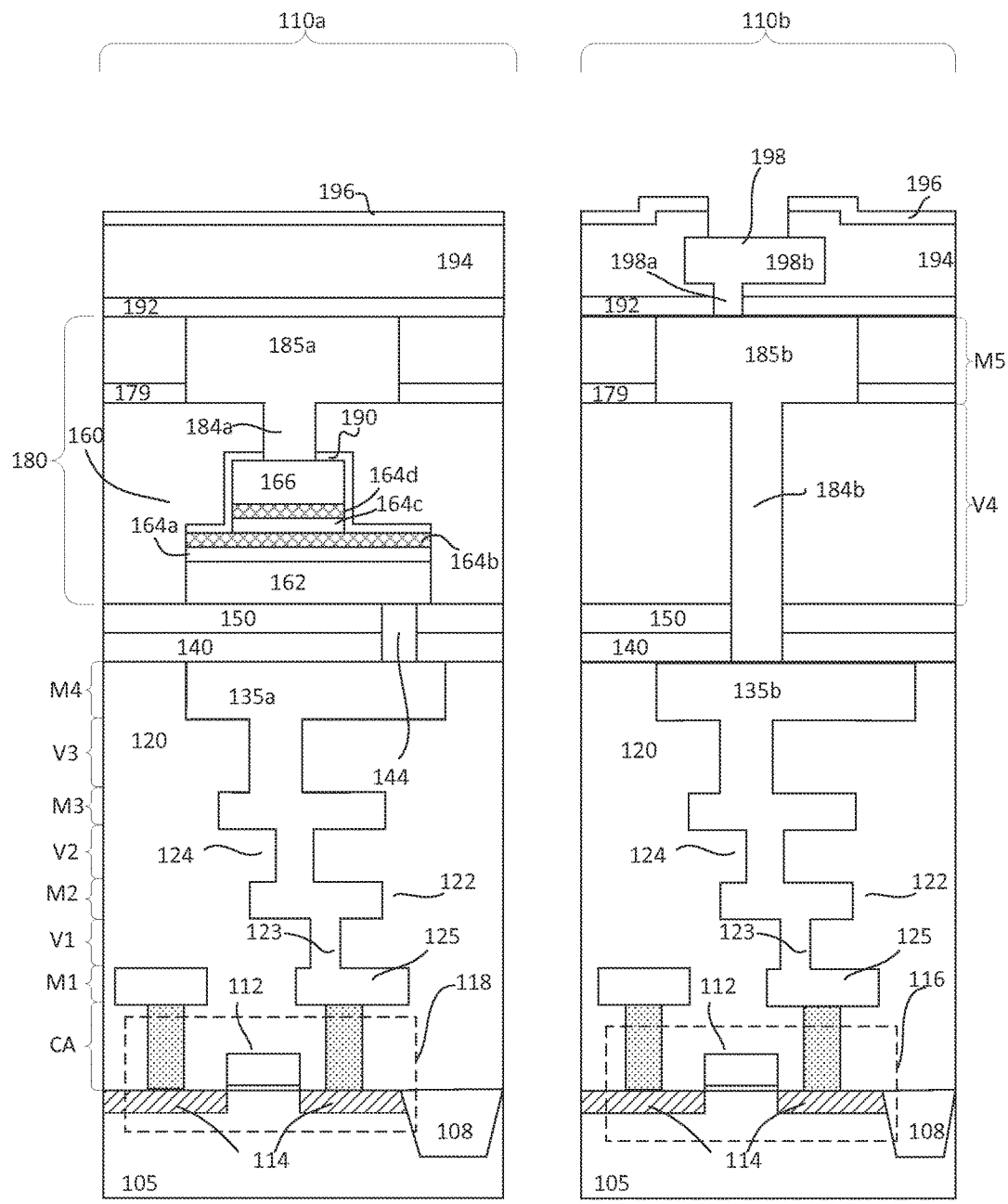
FIG. 1a shows cross-sectional views of memory and logic regions of an embodiment of a device and FIG. 1b shows enlarged cross-sectional views of memory and logic portions of the device.
Figure 1B:
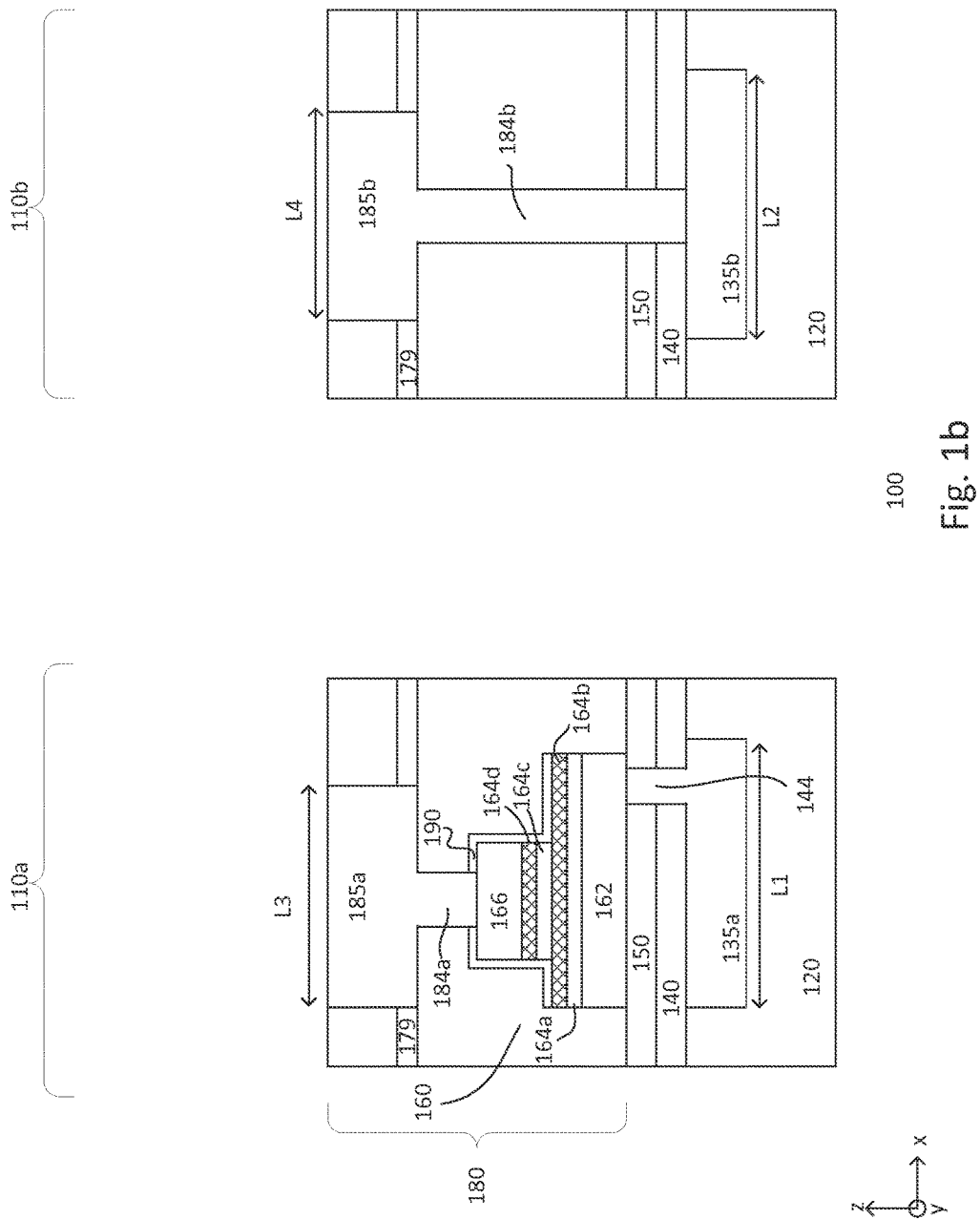

FIG. 1a shows cross-sectional views of first (or memory) region 110a and second (or logic) region 110b of an embodiment of a device 100. FIG. 1b shows enlarged cross-sectional views of memory and logic portions of the device 100. The cross-sectional view, for example is along a bitline direction of the device. The device, as shown, includes a memory cell, a cell selector unit or transistor and one or more logic transistors. The memory cell, for example, may be a NVM memory cell. The memory cell, in one embodiment, is a magnetoresistive NVM cell, such as a STT-MRAM cell.

The memory cell, the cell select unit and the logic transistor are disposed on a substrate 105. For example, the memory cell 160 and the cell selector unit 118 is disposed in the first region 110a of the substrate and the logic transistor 116 is disposed in the second region 110b of the same substrate. The first region is a memory cell region which may be part of an array region. For example, the array region may include a plurality of cell regions. The substrate may also include other types of device regions (not shown).

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystallineon-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors in the memory cell region 110a, the logic region 110b as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a memory cell region 110a and logic region 110b isolated by isolation regions 108, such as shallow trench isolation (STI) regions. The memory cell region is for a memory cell. Isolation regions may be provided to isolate columns of memory cells. Other configurations of isolation regions may also be useful. The first region 110a may include a cell device well (not shown) while the second region 110b may include a logic device well. The cell device well, for example, serves as a body well for a cell select transistor 118 of the memory cell 160 while logic device well, for example, serves as a body well for logic transistor. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

As shown, the first region includes a cell selector unit 118 and a memory cell 160 while the second region includes a logic transistor 116. The cell selector unit includes a selector for selecting the memory cell. The selector, for example, may be a select transistor. In one embodiment, the select transistor is a metal oxide semiconductor (MOS) transistor. Thus, the FEOL forms the cell selector transistor in the first region and logic transistor in the second region. The transistors, as shown, include first and second source/drain (S/D) regions 114 formed in the substrate and a gate 112 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline direction. The gate conductor forms a common gate for a row of cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the cell selector unit in the first region and other transistors, including logic transistors, in the second region, back end of line (BEOL) processing is performed. The BEOL process includes forming interconnects in interlevel dielectric (ILD) layers. The interconnects connect the various components of the IC to perform the desired functions. An ILD level includes a metal level 122 and a contact level 124. Generally, the metal level includes conductors or metal lines 125 while the contact level includes via contacts 123. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$ where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is a silicon oxide layer. Other types of dielectric layers may also be useful.

The dielectric layer may be formed by CVD. Other techniques for forming the dielectric layer may also be useful.

Conductive lines 125 are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional or upper ILD layers/levels. The additional ILD levels may include ILD level 2 to ILD level x. For example, in the case where x=5 (5 levels), the upper ILD level includes ILD levels from 2 to 5, which includes M2 to M5. Designating other ILD levels as upper ILD level may also be useful. The number of ILD levels may depend on, for example, design requirements or the logic process involved. The ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below.

As shown, S/D contacts are disposed in the CA level. The S/D contacts are coupled to the first and second S/D regions of the transistors in the first and second regions. Other S/D contacts to other S/D regions of transistors may also be provided. The CA level may include a gate contact (not shown) coupled to the gate of the transistor. The gate contact may be disposed in another cross-section of the device. The gate contact is coupled to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. As an example, a SL is coupled to the second S/D region of the select transistor. As for the first S/D contact, it may be coupled to contact pad or island in M1. The contact pads provide connections to upper ILD levels. The metal lines or pads may be formed of copper or copper alloy. Other types of conductive material may also be useful.

As for the additional or upper ILD levels, for example, from 2 to 5, they include contacts 123 in the via level 124 and contact pads/metal lines 125 in the metal level 122. The contacts and contact pads provide connection from M5 to the first S/D region of the transistors in the first and second regions.

As shown in FIG. 1a, the first region 110a accommodates a MRAM cell 160 and the second region 110b accommodates a logic component. The MRAM cell is generally disposed in between adjacent final metal levels of upper ILD level in the first region 110a of the device. In one example, the MRAM cell is formed in between adjacent upper ILD levels, such as upper ILD level 4 to 5. It is understood that the MRAM cell may be disposed in between any suitable adjacent ILD levels. For illustration purpose, the enlarged cross-sectional views of the memory and logic portions of the device shown in FIG. 1b show a dielectric layer 120 which corresponds to upper ILD level 4. The upper ILD level 4, for example, includes a via level and a metal level. The upper ILD level 4, for example, includes via level V3 and metal level M4. One or more via contacts (not shown) may be disposed in V3 in the first and second regions 110a-110b.

For the sake of simplicity, the dielectric layer 120 in this disclosure may be referred to as a first upper dielectric layer and its via and metal levels may be referred to as a first upper interconnect level. As shown in the first region, a metal line 135a is disposed in the metal level (e.g., M4) of the first upper dielectric layer 120. The metal line 135a, for example, is coupled to the MRAM cell which will be described later. The metal line 135a, for example, may serve as a bitline (BL) or may be used for connection purpose. Although one metal line 135a is shown, it is understood that there could be other suitable number of metal lines in the same metal level of the first region.

The metal line 135a includes a conductive material. The conductive material, for example, includes copper (Cu). Other suitable types of conductive material may also be useful. The dimensions of this metal line 135a and its underlying via contact (not shown), for example, are defined at the minimum line resolution of the lithography and etch capability for a technology process node, which may be referred to as 1× design rule. The thickness of the metal line with reference to the top surface of the first upper dielectric layer 120, for example, is about 1400 Å. The metal line 135a, for example, includes a length L1 of about 200 nm when viewed in a first or x direction as shown in FIG. 1b. L1, in one embodiment, may include the same length as the length L2 of interconnects 135b formed in the same metal level of the second (or logic) region 110b. Alternatively, L1 may be different than L2. Other suitable thickness and length dimensions may also be useful, depending on the design requirements of a technology node.

Referring to the memory portion of the device, a dielectric liner 140 is disposed above the first upper dielectric layer 120 covering the metal line 135a in the first region. The dielectric liner, for example, serves as an etch stop layer. The dielectric liner may be a low k dielectric liner. For example, the dielectric liner may be nBLOK. Other suitable types of dielectric materials for the dielectric liner may also be useful.

A second upper dielectric layer 150 is disposed on the first upper dielectric layer 120. For example, the second upper dielectric layer is disposed on the dielectric liner 140. The second upper dielectric layer, in one embodiment, is TEOS. Any suitable dielectric materials and thicknesses for the second upper dielectric layer may be useful.

In the first region 110a, a MRAM cell 160 is disposed over the second upper dielectric layer 150. In one embodiment, the MRAM cell is a STT-MRAM cell. Other suitable types of memory cells may also be useful. The MRAM cell includes a storage unit which is a magnetic memory element, such as a MTJ element.

The memory element includes first and second electrodes 162 and 166. The first electrode, for example, may be a bottom electrode while the second electrode may be a top electrode. Other configurations of electrodes may also be useful. The bottom electrode 162 of the memory element is connected to the metal line 135a through a via plug 144 which extends through the second upper dielectric layer and dielectric liner. The via plug, for example, includes a conductive material, such as Cu. Other suitable types of conductive material may also be useful.

The memory element includes a MTJ stack 164 disposed in between the top and bottom electrodes. The memory element, for example, may include a bottom-pinned MTJ element or a top-pinned MTJ element. Top and bottom refer to position of layers relative to the substrate surface. For illustration purpose, the MTJ stack includes four layers. It is understood that the MTJ stack may include other suitable number of layers. The MTJ stack generally includes a magnetically fixed (pinned) layer 164a, one or more tunneling barrier layers 164b and 164d and a magnetically free layer 164c. The fixed layer includes a magnetic layer and a pinning layer. The pinning layer, for example, pins the magnetization direction of the magnetic layer, forming a pinned layer.

The free layer may be CoFeB, the tunneling barrier layer may be MgO or $Al_2O_3$, and the magnetic layer may be CoFeB/Ru/CoFeB. As for the pinning layer, it may be PtMn or IrMn. The top and bottom electrodes may be Ti, TiN, Ta, TaN or other suitable metals used in the semiconductor process. Other suitable configurations or materials of memory element may also be useful.

The top electrode and upper layers of the MTJ stack of the memory cell, for example, include a length dimension which is smaller than a length dimension of the lower layers of the MTJ stack and bottom electrode. For example, the length of the top electrode and MTJ stack is about 85 nm while the length of the bottom electrode is about 200 nm. Other suitable length dimensions may also be useful.

In one embodiment, a dielectric liner 190 may line exposed top surface of the bottom electrode 162, side surfaces of the MTJ stack 164 and top and side surfaces of the top electrode 166, as shown in FIG. 1b. The dielectric liner 190, for example, serves as an etch stop layer or protective liner which protects the top electrode during processing. The dielectric liner may be a low k dielectric liner. For example, the dielectric liner may be nBLOK. Other suitable types of dielectric materials for the dielectric liner may also be useful.

A dielectric layer 180 is disposed over the second upper dielectric layer 150, covering the memory cell. The dielectric layer and the second upper dielectric layer, for example, corresponds to upper ILD level 5. The dielectric layer, for example, is a dielectric stack having one or more dielectric layers. For instance, the dielectric layer 180 may include third, fourth, fifth and sixth or other suitable number of upper dielectric layers. The dielectric layer 180 includes TEOS. Other suitable configurations and materials for the dielectric layer may also be useful. One or more dielectric liners or etch stop layers, such as dielectric liner 179, may be disposed in between the upper dielectric layers.

The dielectric layer 180, for example, includes a via contact 184a which couples a metal line 185a to the top electrode 166 of the memory cell. The metal line 185a is disposed in the metal level while the via contact is disposed in the via level of the dielectric layer 180. For simplicity, the via and metal levels of the dielectric layer 180 may be referred to as a second upper interconnect level. For example, the metal line 185a may be disposed in metal level M5 while the via contact may be disposed in via level V4 of the first region. The metal line 185a, for example, may serve as a bitline (BL). Providing the bitline at other metal level may also be useful. Although one metal line 185a is shown, it is understood that there could be other suitable number of metal lines in the same metal level of the first region.

The via contact 184a, for example, may be referred to as the top via contact and the metal line 185a, for example, may be referred to as the top metal line. The dimensions of this metal line 185a and its underlying via contact 184a, for example, are defined at twice the minimum line resolution of the lithography and etch capability for a technology process node, which may be referred to as 2× design rule. For example, the thickness of the top metal line 185a, for example, may be at least 2 times greater than the thickness of the metal line 135a below. The top metal line 185a includes a thickness of, for example, about 3600 Å and having a length L3 of about 200 nm while the top via contact 184a, for example, includes a length of about 110 nm when viewed in the first or x direction as shown in FIG. 1b. L3, for example, may include the same length as the length L4 of interconnects 185b formed in logic region 110b in the same ILD level. Alternatively, L3 may be different than L4. Other suitable thickness and length dimensions may also be useful, depending on the design requirements of a technology node. The top via contact and top metal line include a conductive material, such as Cu. Other suitable configurations and conductive materials for the via contact and metal line may also be useful.

Referring to the logic portion of the device shown in FIG. 1b, the second (or logic region) 110b includes common or similar features as that described for the first region. Thus, common features or elements may not be described in detail.

In the second region 110b, a metal line 135b is disposed in the metal level (e.g., M4) of the first upper dielectric layer 120. The metal line 135b may be referred to as a lower interconnect of the upper ILD levels in the second region. The metal line 135b may be coupled to contact regions of logic transistor (not shown) disposed on the substrate. Although one metal line 135b is shown, it is understood that there could be other suitable number of metal lines in the same metal level of the second region. The metal line 135b, for example, may include a length L2 and depth dimensions which are the same as the length L1 and thickness of metal line 135a formed in the first (or memory) region 110a. Alternatively, L2 may be different than L1. Other suitable thickness and length dimensions may also be useful.

As shown in the second region 110b, the dielectric layer 180 also includes a metal line 185b in the metal level and a via contact 184b disposed in the via level of the dielectric layer 180. For example, the metal line 185b may be disposed in metal level M5 while the via contact 184b may be disposed in via level V4. Although one metal line 185b is shown, it is understood that there could be other suitable number of metal lines.

The via contact 184b, for example, may be referred to as the top via contact and the metal line 185b, for example, may be referred to as the top metal line. The thickness of the top metal line 185b, for example, may be at least 2 times greater than the thickness of the metal line 135b below. The length L4 of the top metal line 185b, for example, may be the same or different than the length L3 of the metal line 185a formed in memory region 110a in the same ILD level. Other suitable thickness and length dimensions may also be useful. The top via contact 184b, as shown in FIG. 1b, couples the metal line 185b in upper metal level to the metal line 135b in lower metal level. The top via contact 184b, for example, extends through the second upper dielectric layer 150 and dielectric liner 140.

In one embodiment, the top via contacts 184a-184b and top metal lines 185a-185b in the first and second regions are dual damascene interconnect structures. The dual damascene interconnect structures in the first and second regions are formed simultaneously using a simplified and cost effective technique as will be described in FIGS. 2a-2o later.

Referring back to FIG. 1a, a pad level is disposed over the uppermost ILD level. For example, a pad dielectric level is disposed over Mx. In the case where the device includes 5 metal levels, the pad level is disposed over M5. A dielectric liner 192 may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The pad level includes a pad dielectric layer 194. The pad dielectric layer, for example, may be a silicon oxide layer. Other types of pad dielectric layer may also be useful. A passivation layer 196 may be disposed over the pad dielectric layer. The passivation layer covers all chip region except for pad opening areas to prevent from moisture absorption and mechanical scratch. The passivation layer, for example, may be a nitride passivation layer. Other suitable passivation layers may also be useful.

A pad interconnect 198 is disposed in the pad level in the second region 110b. The pad interconnect, in one embodiment, is an aluminum pad interconnect. Other conductive materials may also be useful to serve as the pad interconnect. The pad interconnect includes a pad via contact 198a and a contact pad 198b. The pad via contact is disposed in the pad via level of the pad dielectric layer. The pad via contact penetrates the dielectric liner 192, contacting an interconnect in the metal level below. For example, the pad via contact electrically connects to the metal line 185b in M5. Above the pad via contact is the contact pad 198b. The contact pad is disposed in the upper pad level. As shown, the contact pad is disposed over the pad via contact level, with the passivation layer covering or lining it. An opening in the passivation layer exposes the contact pad for subsequent wire bonding to provide external connections to the device.

FIGS. 2a-2o show simplified cross-sectional views of a process 200 for forming an embodiment of a device. In one embodiment, the process allows a memory cell to be formed with logic components on the same substrate using logic processing. The memory cell, for example, may be a MRAM cell. The MRAM, in one embodiment, is a STT-MRAM cell. The device formed, for example, is similar to that shown and described in FIGS. 1a-1b. Common elements may not be described or described in detail.

For simplicity, the processing of a substrate to form transistors using FEOL and processing of lower ILD level and lower levels of an upper ILD level using BEOL are not shown. Referring to FIG. 2a, the process 200 is at the stage of providing a dielectric layer 120 over a substrate (not shown). The dielectric layer 120, for example, may correspond to upper ILD level 4. For the sake of simplicity and for illustration purpose, the dielectric layer 120 may be referred to as a first upper dielectric layer and its via and metal levels may be referred to as a first upper interconnect level.

The process includes forming suitable via openings (not shown) and trenches in the first (or memory) region 110a and second (or logic) region 110b. First type trenches 235 are formed in the first upper dielectric layer 120 of the first and second regions 110a and 110b. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed.

In one embodiment, the trenches 235 in the first and second regions are formed simultaneously. The trenches, for example, include the same depth dimension defined by, for example, 1× design rule. The depth of the trenches, for example, is about 1400 Å with reference to the top surface of the first upper dielectric layer. The trench 235 in the first region includes a length L1. L1, for example, includes any suitable length which may be the same or different than the length L2 of interconnects formed in the same metal level of logic region 110b. For example, L1 and L2 is about 200 nm. Other suitable dimensions may also be useful, depending on design requirement of a technology node.

The process continues by depositing a conductive layer on top of the first upper dielectric layer and fills the trenches. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The trenches filled with conductive material form a metal line 135a in the first region and a metal line 135b in the second region. Although one metal line is shown in the first and second regions, it is understood that there could be more than one metal line being formed in the same metal level of the first and second regions. The metal line 135a may be coupled to a MRAM cell which will be formed in the first region while metal line 135b correspond to an interconnect in a metal level in the second region. As shown, the process forms metal lines 135a and 135b simultaneously in a metal level (e.g., M4) of the device.

Referring to FIG. 2a, a dielectric liner 140 is formed above the first upper dielectric layer covering metal lines 135a and 135b in the first and second regions. The dielectric liner, for example, serves as an etch stop layer. The dielectric liner may be a low k dielectric liner. For example, the dielectric liner may be nBLOK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 150. As shown in FIG. 2b, a second upper dielectric layer 150 is formed on the first upper dielectric layer. For example, the second upper dielectric layer is formed on the dielectric liner 140. The second upper dielectric layer, in one embodiment, is tetraethyl orthosilicate (TEOS). The second upper dielectric layer may be formed by CVD. Any other suitable forming techniques or suitable materials and thicknesses for the second upper dielectric layer may also be useful.

In FIG. 2b, the second upper dielectric layer 150 and the dielectric liner 140 in the first region are patterned to form a via opening 244. The via opening, for example, exposes a portion of the metal line 135a in the metal level below. The opening may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to expose a portion of the metal line 135a below.

The process continues by depositing a conductive layer in the via opening 244. The conductive layer, for example, may include Cu and may be formed by CVD. Other suitable conductive materials and deposition techniques may also be employed. A CMP process is performed to remove excess conductive material on top of the second upper dielectric layer and to provide a substantially planar surface. The via opening 244 filled with conductive material forms a via plug 144.

The process continues to form a MRAM cell. Various layers are formed on the second upper dielectric layer 150 as shown in FIG. 2c. For example, various layers of memory element of the MRAM cell are sequentially formed over the second upper dielectric layer in both the first and second regions. A bottom electrode layer 262 is deposited over the second upper dielectric layer in the first and second regions. The process continues to form various layers of the MTJ stack 264 and top electrode layer 266 over the bottom electrode layer by physical vapor deposition (PVD) process. Other suitable techniques may be used. The MTJ stack, for example, is shown to include four layers 264a-264d. It is understood that the MTJ stack may include other suitable number of layers. Materials of the top and bottom electrode layers and MTJ stack are the same as that described in FIGS. 1a-1b.

The process continues to pattern the top electrode layer and upper layers of the MTJ stack as shown in FIG. 2d. Patterning the layers may be achieved with mask and etch techniques. As shown in FIG. 2d, a patterned mask (not shown) is used define the tunnel barrier 164d and free layer 164c of the MTJ stack and top electrode 166 of the memory cell by removing portions of the upper layers of the MTJ stack and top electrode layer not protected by the patterned mask in the first region. As shown, the top electrode layer 266, the free layer 264c and tunnel barrier layer 264d of the MTJ stack are completely removed from the second region. Other suitable techniques for patterning the upper layers of the MTJ stack and top electrode layer may also be useful. As shown, the bottom electrode layer 262, the fixed layer and the tunnel barrier layer 264a-264b remain unetched in the first and second regions. The patterned mask is removed using suitable techniques, such as ashing.

The process continues by depositing a dielectric liner 390 over the first and second regions as shown in FIG. 2e. The dielectric liner 390 covers exposed surfaces of the top electrode and patterned MTJ layers and top surface of the bottom electrode layer in the first region while covering top surface of the tunneling barrier 264b in the second region. The dielectric liner 390, for example, may be formed by CVD and serves as an etch stop layer or protective layer during subsequent processing. The dielectric liner may be a low k dielectric liner. For example, the dielectric liner may be nBLOK. Other suitable types of dielectric materials for the dielectric liner and forming techniques may also be useful.

Referring to FIG. 2f, a third upper dielectric layer 272 is formed. The third upper dielectric layer is formed over the dielectric liner 390 in the first and second regions. The third upper dielectric layer, for example, is TEOS. The third upper dielectric layer may be formed by CVD. Other suitable dielectric materials and techniques may be used for forming the third upper dielectric layer.

In FIG. 2g, the process continues to pattern the third upper dielectric layer 272, the dielectric liner 390, the tunneling barrier layer 264b, the fixed layer 264 and the bottom electrode layer 262. Patterning the layers may be achieved by mask and etch techniques. The patterning process defines the tunnel barrier 164b, the fixed layer 164a and bottom electrode 162 of the memory cell in the first region. The bottom electrode layer 262, the lower layers of the MTJ stack, the dielectric liner 390 and the third upper dielectric layer 272 in the second region are completely removed. The etch stops when it reaches top surface of the second upper dielectric layer 150. As shown in FIG. 2g, the bottom electrode 162, the fixed layer 164a and the tunnel barrier 164b of the memory cell in the first region includes a length which is greater than the length of the free layer 164c and tunnel barrier 164d of the MTJ stack 164 and top electrode 166 in the first direction such that it is easy for process control and to prevent electrical shorts between the top and bottom electrodes as well as to prevent electrical shorts between the free and fixed layers of the MTJ stack. The mask is removed thereafter.

As shown, the MTJ stack and the top and bottom electrode layers are patterned in such a way that the bottom electrode and the MTJ stack are aligned and properly coupled to the via plug 144 in the first region 110a. This may be achieved using various techniques, including the alignment techniques as described in concurrently filed U.S. patent application Ser. No. 14/862/173, titled "MAGNETIC TUNNEL JUNCTION STACK ALIGNMENT SCHEME", which is herein incorporated by reference for all purposes. Other suitable techniques for patterning the layers and to ensure that the bottom electrode and MTJ stack align and properly couple to the underlying via plug 144 in the first region may also be useful.

Figure 2H:
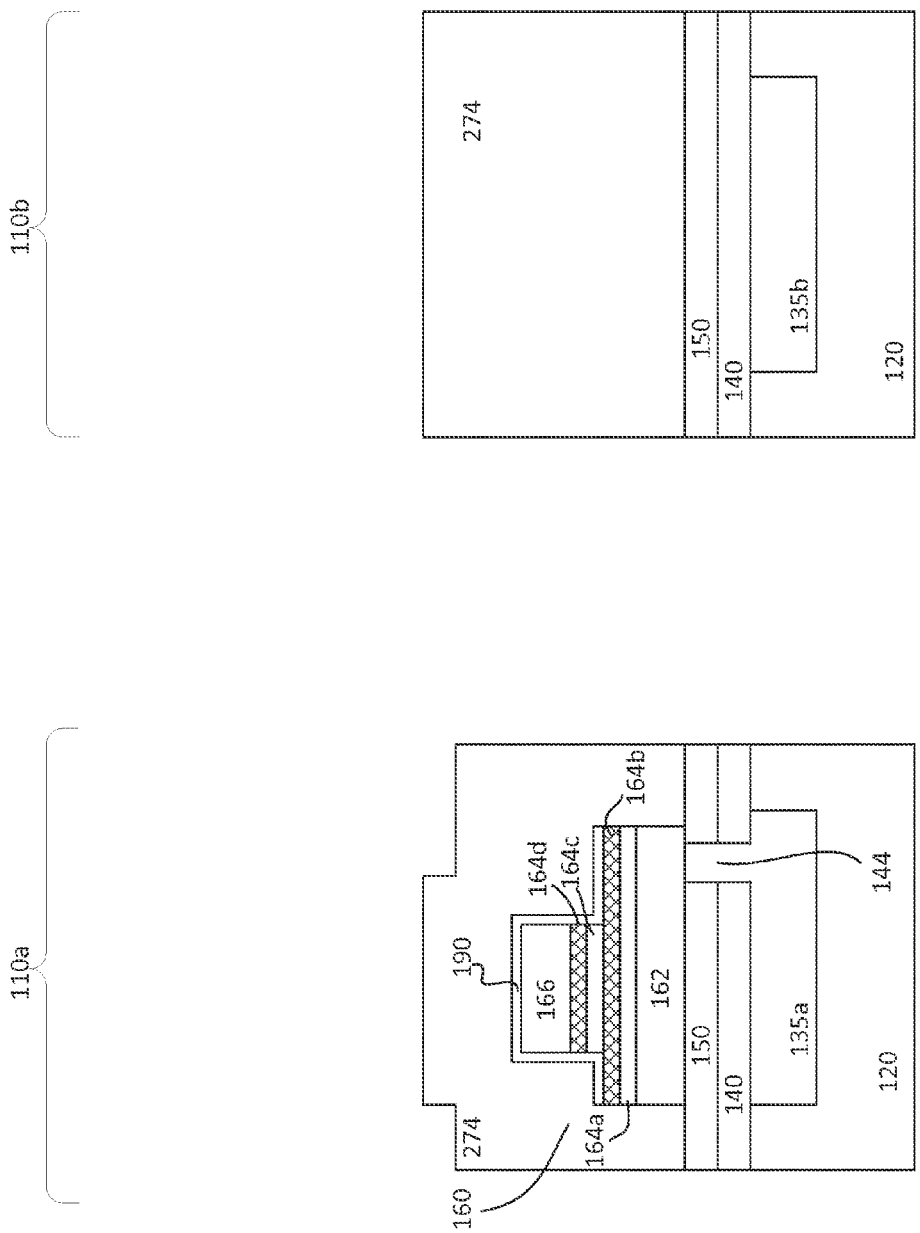
FIGS. 2a-2o show cross-sectional views of an embodiment of a process for forming a device.

A fourth upper dielectric layer 274 is formed on the substrate, as shown in FIG. 2h. The fourth upper dielectric layer is formed over the second upper dielectric layer 150 in the first and second regions and sufficiently covers the patterned MTJ stack and top and bottom electrodes in the first region. The fourth upper dielectric layer, for example, is TEOS. The fourth upper dielectric layer may be formed by CVD. Other suitable dielectric materials and techniques may be used for forming the fourth upper dielectric layer.

A planarization process is performed to remove excess fourth upper dielectric layer. The planarization process, for example, may be achieved by CMP. Other suitable techniques may also be useful. The planarization process produces a substantially planar top surface between the top surface of the dielectric liner 190 and fourth upper dielectric layer 274 in the first region as shown in FIG. 2i. As shown, the planarized fourth upper dielectric layer 274 surrounds and covers the sides of the memory element 160 in the first region.

As shown in FIG. 2j, the process continues to form a fifth upper dielectric layer 276. The fifth upper dielectric layer is formed over the fourth upper dielectric layer 274 in the first and second regions and sufficiently covers the top surface of the patterned dielectric liner 190 in the first region. The fifth upper dielectric layer, for example, is TEOS. The fifth upper dielectric layer may be formed by CVD. Other suitable dielectric materials and techniques may be used for forming the fifth upper dielectric layer.

In one embodiment, the process continues to form a dielectric liner 179 over the fifth upper dielectric layer 276 in the first and second regions. The dielectric liner, for example, is nBLOK. The dielectric liner 179, for example, may serve as an etch stop layer during subsequent processing and may be formed by CVD. Other suitable dielectric materials and techniques may be used for forming the dielectric liner 179.

Figure 2K:
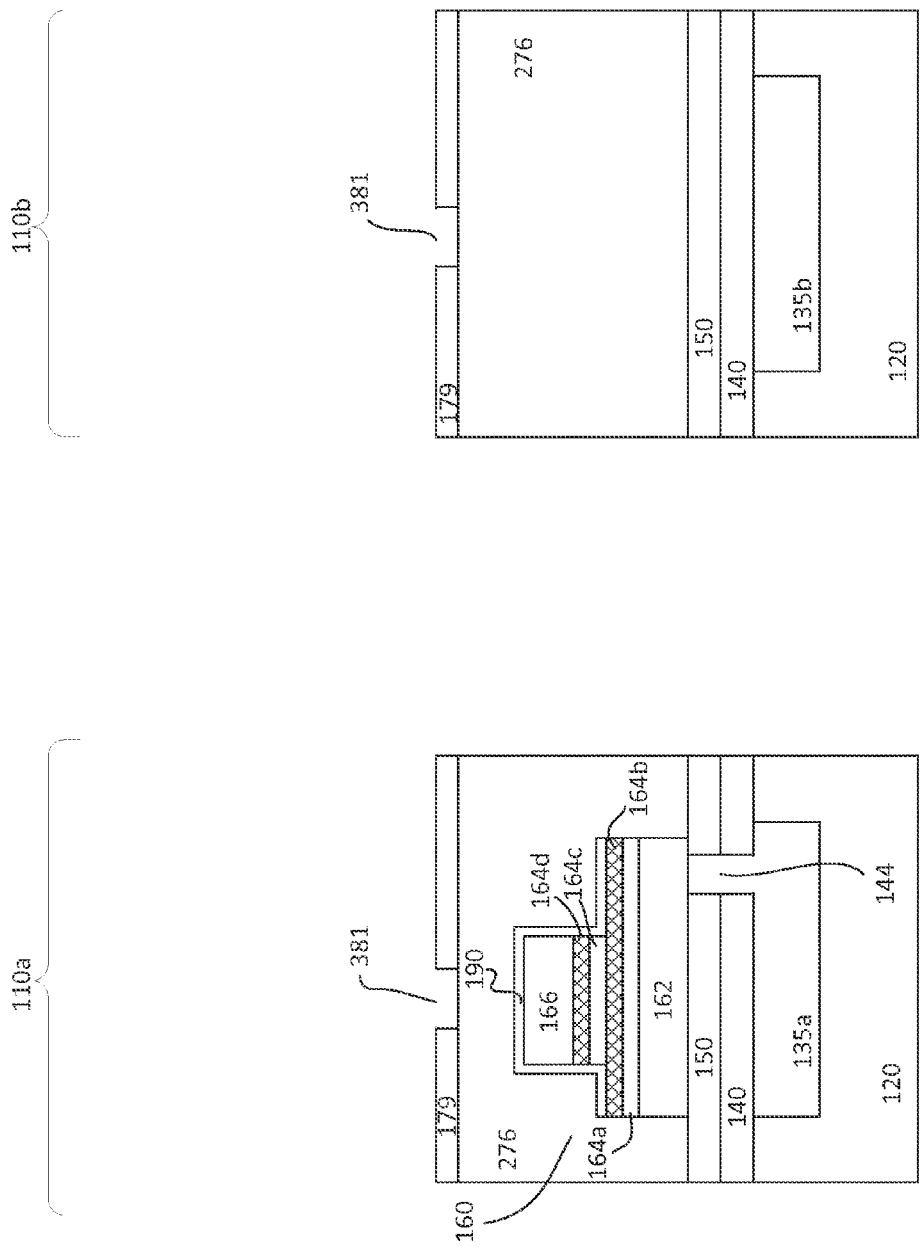
Figure 21:
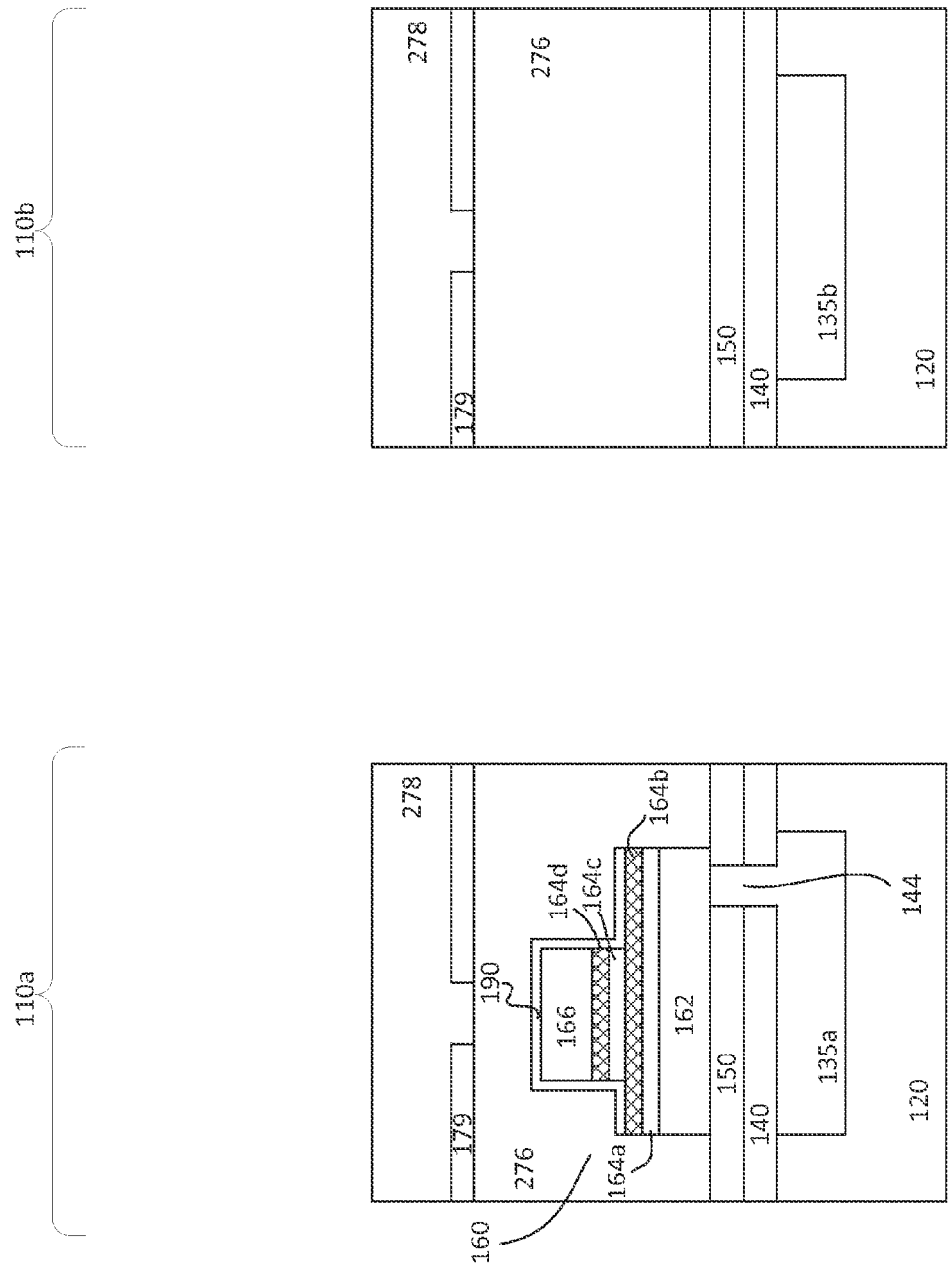

In one embodiment, the dielectric liner 179 is processed to form openings 381 in the first and second regions as shown in FIG. 2k. In one embodiment, the openings 381 expose portions of the underlying fifth upper dielectric layer 276 which will be removed to form via openings later. To form the openings 381, mask and etch techniques can be employed. For example, a mask (not shown), such as a photoresist, can be used to form the openings in the dielectric liner 179. Exposed portions of the dielectric liner 179 in the first and second regions which are not covered by the mask pattern are removed by, for example, a dry etch or RIE. Other suitable techniques may also be employed to form the openings 381 in the dielectric liner 179.

Referring to FIG. 2l, a sixth upper dielectric layer 278 is formed over the dielectric liner 179. The sixth upper dielectric layer, for example, is TEOS and may be formed by CVD. Other suitable dielectric material and techniques may be employed for forming the sixth upper dielectric layer. In one embodiment, the sixth upper dielectric layer also fills the openings 381 in the first and second regions. The third, fourth, fifth and sixth upper dielectric layers in combination, for example, may be referred to as a dielectric layer 180.

In one embodiment, the process continues to form dual damascene openings having trenches and via openings in the dielectric layer 180 in the first and second regions. Referring to FIG. 2m, the sixth upper dielectric layer 278 is patterned to form second type trenches 285 in the first and second regions simultaneously. The trenches 285, for example, may be defined based on 2× design rule. The trenches may be formed by mask and etch techniques. For example, a mask (not shown), such as photoresist, may be used to serve as an etch mask to pattern the upper dielectric layer 278 to form the trenches in the first and second regions. A first etch, for example, which is highly selective to the materials of the dielectric layer is employed to remove exposed portions of the dielectric layer to form the trenches. In one embodiment, since the openings 381 in the dielectric liner 179 are filled with sixth upper dielectric layer, the first etch simultaneously removes the exposed portion of the sixth upper dielectric layer to forms trenches and removes the underlying dielectric material of the fifth upper dielectric layer to form via openings which pass through the openings 381 in the dielectric liner. As shown, the first etch forms the via opening 284a in the first region and stops when it reaches the dielectric liner 190 while the first etch continues to remove dielectric materials to form the via opening 284b in the second region. In this case, the dielectric liner 190 protects the top electrode 166 from being consumed while the first etch continues to form via opening in the second region. Thus, the trenches and via openings in the first and second regions, for example, are formed by the same first etch process. The via opening 284a in the first region, for example, includes a depth of about 700 Å while the via opening 284b in the second region, for example, includes a depth of about 2200 Å. Other suitable depth dimensions may also be useful. Since the first etch is highly selective to the materials of the dielectric layer, the first etch, for example, stops when it reaches top surface of the dielectric liners 179, 190 and 140. In other embodiments, the etch may partially consume the dielectric liners 179, 190 and 140.

Figure 2N:
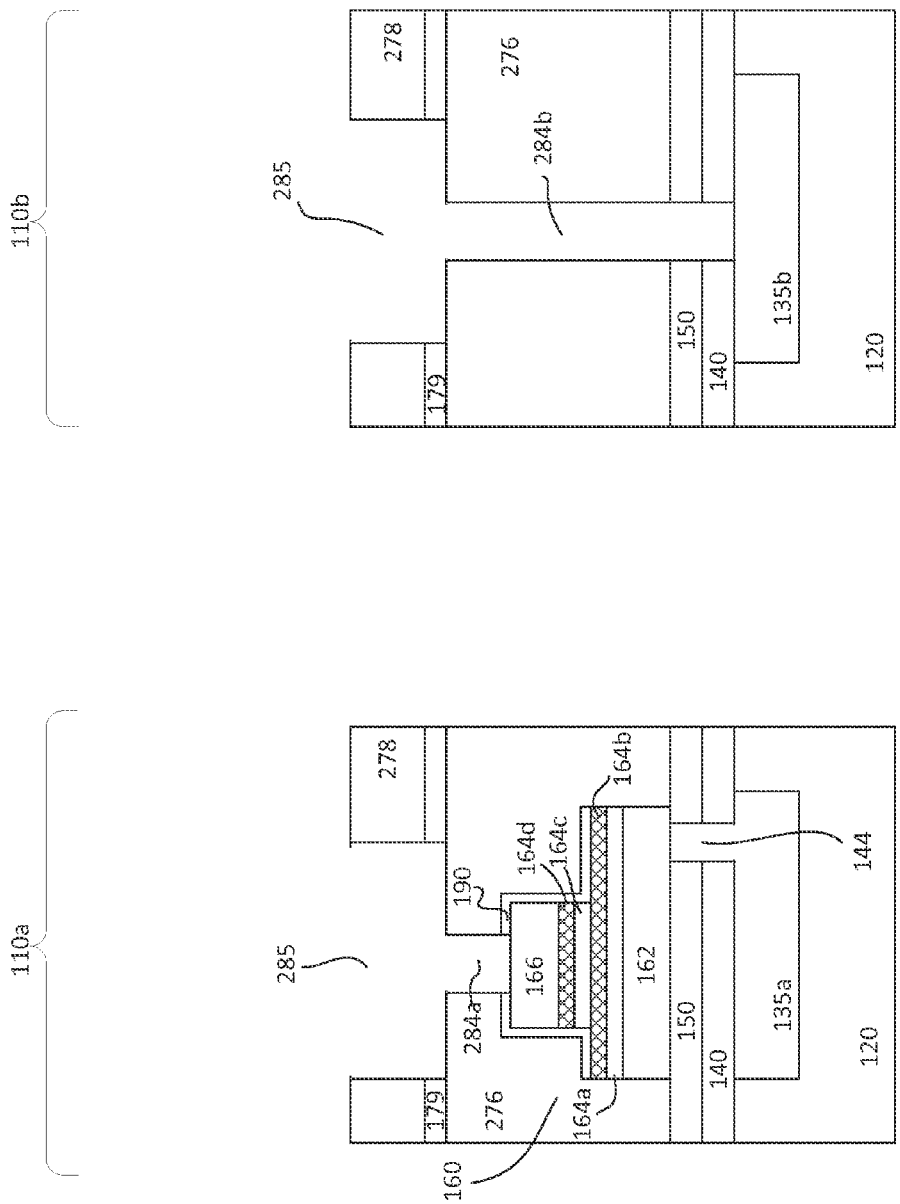
Figure 20:
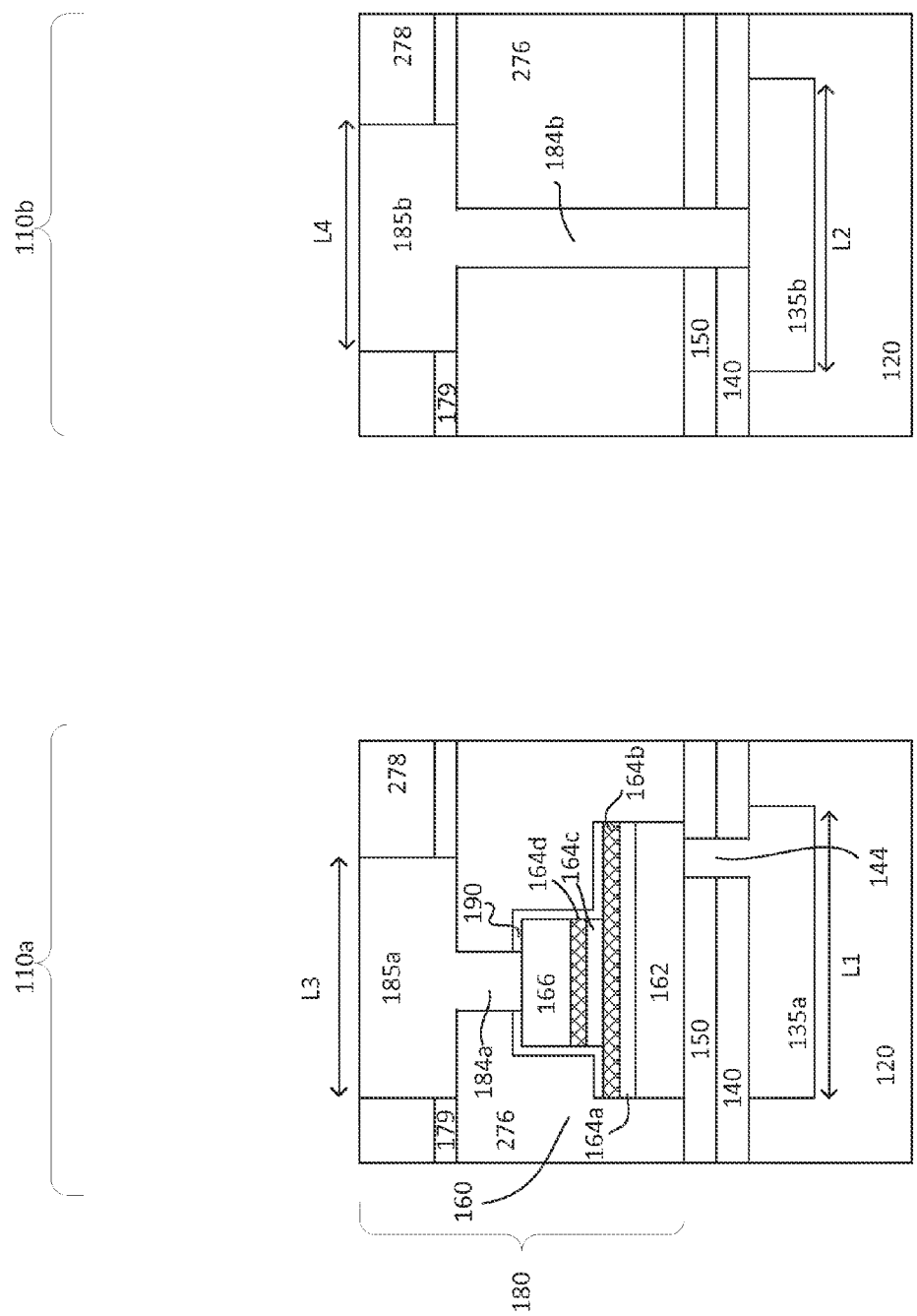

The process continues to remove exposed portions of the dielectric liners 179, 190 and 140 in the first and second regions as shown in FIG. 2n. For example, a second etch which is highly selective to the materials of the dielectric liners are employed to remove exposed portions of the dielectric liners. This, for example, exposes top surface of the top electrode 166 in the first region and top surface of the metal line 135b in the second region. Thus, dual damascene openings are formed in the first and second regions. As shown, the trench 285 in the first region is in communication with the via opening 284a which is in communication with the top electrode 166 while the trench 285 in the second region is in communication with the via opening 284b which is in communication with metal line 135b as shown in FIG. 2n.

Referring to FIG. 2o, a conductive layer is formed. The conductive layer covers the dielectric layer 180 as well as filling the trenches and via openings. For example, the conductive layer fills both the trenches and via openings in the first and second regions. The conductive layer should be sufficiently thick to fill the trenches and via openings. Excess conductive material is removed by CMP, forming metal line 185a and top via contact 184a in the first region as well as metal line 185b and via contact 184b in the second region as shown in FIG. 2o. As shown, the top surface of the metal lines is substantially planar with the top surface of the dielectric layer 180. The metal lines and top via contacts in the first and second regions are formed by dual damascene process.

The process continues to complete formation of the IC. The process, for example, may continue to form passivation layer and pad interconnects or bonding pads. Further processing can include final passivation, dicing, assembly and packaging. Other processes are also useful.

As described, the device includes one memory cell. However, it is understood that a device may include numerous memory cells integrated into the same IC.

The embodiment as described in FIGS. 1a-1b and FIGS. 2a-2o result in advantages. The process as described is highly compatible with logic processing or technology. For example, memory cell are formed concurrently on the same substrate using logic processing without compromising the reliabilities of the memory cell and other components in the logic region on the same substrate. Moreover, the process as described is useful for MRAM integration with top via plug module. The process as described can save the cost of one mask since the same mask is being used to create both top via opening at the memory region and top via opening at the logic region. Furthermore, the process as described also offers a simplified and cost saving solution as the formation of the top metal trenches would also result in simultaneous formation of underlying top via openings, allowing formation of dual damascene openings having trenches and via openings to be formed in a single step. This embodiment as described is also flexible as it can be used to integrate MTJ cell of various sizes, both for in-plane and perpendicular architecture with top via plug within thin wire low-k material. Moreover, the process as described avoids investment of new tools and does not require additional or new masks.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate defined with at least first and second regions, the first region comprises a memory region for magnetic random access memories (MRAMs) and the second region comprises a logic region, wherein the substrate is prepared with
front-end-of-line (FEOL) components on the substrate in the first and second regions, and
a lower back-end-of-line (BEOL) dielectric layer disposed over the substrate covering the FEOL components, the lower BEOL dielectric layer comprises
L interconnect dielectric (ILD) level, where L is a whole number greater than or equal to 1 but less than x, where x is the total number of ILD levels for the device, and
wherein an $i^{th}$ ILD level of the device comprises a via level $V_{i-1}$ dielectric below a metal level $M_i$ dielectric, where i is from 1 to x, and the via level $V_{i-1}$ dielectric includes contacts and the metal level $M_i$ dielectric includes metal lines;
forming a lower dielectric liner on a metal level $M_L$ dielectric, which is a top of the lower BEOL dielectric layer in the first and second regions;
forming a magnetic tunnel junction (MTJ) stack of a magnetic random access memory (MRAM) cell in the first region of the substrate on the lower dielectric liner, the MTJ stack includes a MTJ disposed between top and bottom electrodes, wherein the MTJ stack includes a lower MTJ portion which includes the bottom electrode and an upper MTJ portion which includes the top electrode, the bottom electrode is electrically coupled to a lower metal line in the metal level $M_L$ dielectric below through an opening in the lower dielectric liner, wherein the upper MTJ portion and the lower MTJ portion are formed in separate patterning processes, wherein the MTJ stack includes a dielectric liner disposed on the MTJ stack;
forming a dielectric layer on the substrate in the first and second regions, the dielectric layer is disposed on the MTJ stack including the dielectric liner and on the lower dielectric liner, the dielectric layer serves as a via level $V_i$ dielectric above the metal level $M_L$ dielectric;
forming an upper dielectric liner on the dielectric layer in the first and second regions, wherein the upper dielectric liner is patterned to form first and second openings corresponding to first and second vias of first and second dual damascene structures in the first and second regions;
forming a metal level dielectric layer on the upper dielectric liner with the first and second openings in the first and second regions, wherein the metal level dielectric layer serves as a metal level $M_{i+1}$ dielectric;
performing a first etch, wherein the first etch
patterns the metal level dielectric layer, which serves as the metal level $M_{i+1}$ dielectric, to form first and second trenches, and
patterns the dielectric layer, which serves as the via level $V_i$ dielectric, using the upper dielectric liner as an etch mask to form the first and second vias, wherein the first via stops at the dielectric liner and the second via stops at the lower dielectric liner; and
performing a second etch, wherein the second etch
patterns the dielectric liner at the first via to expose the top electrode of the MTJ stack, and the lower dielectric liner at the second via to expose a logic metal line in the metal level $M_L$ dielectric.

2. The method of claim 1 wherein:
the first and second dual damascene structures are filled with metal to form first and second metal lines with first and second via contacts in the first and second dual damascene structures; and
the first metal line of the first dual damascene structure serves as a top metal line.

3. The method of claim 1 wherein forming the MTJ stack comprises:
forming various layers of the MTJ stack on the lower dielectric liner in the first and second regions;
patterning layers of the upper MTJ portion to form the upper MTJ portion in the first region using a first patterning process;
forming the dielectric liner on the substrate, the dielectric liner lines the upper MTJ portion and a top layer of the lower MTJ portion; and
patterning layers of the lower MTJ portion to form the MTJ stack in the first region using a second patterning process with the dielectric liner lining the MTJ stack.

4. The method of claim 3 wherein the second patterning process forms the lower MTJ portion which is larger than the upper MTJ portion.

5. The method of claim 4 wherein:
the layers of the lower MTJ portion comprises
the bottom electrode,
a first fixed layer, and
a first tunneling barrier layer; and
the layers of the upper MTJ portion comprises
a free layer, and
the top electrode.

6. The method of claim 5 wherein the layers of the upper portion comprise a second tunneling barrier layer between the free layer and the top electrode.

7. The method of claim 6 wherein the dielectric layer has a planar top surface.

8. The method of claim 7 comprising planarizing the dielectric layer by chemical mechanical polishing to form the planar top surface.

9. The method of claim 1 wherein the lower dielectric liner comprises:
a first lower dielectric liner on the top of the lower BEOL dielectric layer; and
a second lower dielectric liner on the first lower dielectric liner.

10. The method of claim 9 wherein the first lower dielectric liner on the top of the lower BEOL dielectric layer comprises a low k dielectric layer and serves as an etch stop layer.

11. A method of forming a device comprising:
providing a substrate defined with at least first and second regions, the first region comprises a memory region for magnetic random access memories (MRAMs) and the second region comprises a logic region, wherein the substrate is prepared with
front-end-of-line (FEOL) components on the substrate in the first and second regions, and
a lower back-end-of-line (BEOL) dielectric layer disposed over the substrate covering the FEOL components, the lower BEOL dielectric layer comprises
L interconnect dielectric (ILD) level, where L is a whole number greater than or equal to 1 but less than x, where x is the total number of ILD levels for the device, and
wherein an $i^{th}$ ILD level of the device comprises a via level $V_{i-1}$ dielectric below a metal level $M_i$ dielectric, where i is from 1 to x, and the via level $V_{i-1}$ dielectric includes contacts and the metal level $M_i$ dielectric includes metal lines;
forming a lower dielectric liner on a metal level $M_L$ dielectric, which is a top of the lower BEOL dielectric layer in the first and second regions, wherein the lower dielectric liner comprises
a first lower dielectric liner on the top of the lower BEOL dielectric layer, and
a second lower dielectric liner on the first lower dielectric liner;
forming a magnetic tunnel junction (MTJ) stack of a magnetic random access memory (MRAM) cell in the first region of the substrate on the lower dielectric liner, the MTJ stack includes a MTJ disposed between top and bottom electrodes, wherein the MTJ stack includes a lower MTJ portion which includes the bottom electrode and an upper MTJ portion which includes the top electrode, the bottom electrode is electrically coupled to a lower metal line in the metal level $M_L$ dielectric below through an opening in the lower dielectric liner, wherein the upper MTJ portion and the lower MTJ portion are formed in separate patterning processes, wherein the MTJ stack includes a dielectric liner disposed on the MTJ stack;
forming a dielectric layer on the substrate in the first and second regions, the dielectric layer is disposed on the MTJ stack including the dielectric liner and on the lower dielectric liner, the dielectric layer serves as a via level $V_i$ dielectric above the metal level $M_L$ dielectric;
forming an upper dielectric liner on the dielectric layer in the first and second regions, wherein the upper dielectric liner is patterned to form first and second openings corresponding to first and second vias of first and second dual damascene structures in the first and second regions, wherein forming the first and second dual damascene structures comprises
etching the metal level $M_{i+1}$ dielectric and the via level $V_i$ dielectric to form the first and second vias, wherein the first via stops at the dielectric liner and the second via stops at the first lower dielectric liner; and
etching to remove exposed dielectric liner in the first region to expose the top electrode and exposed first lower dielectric liner in the second region to expose a logic metal line in the metal level $M_L$ dielectric;
forming a metal level dielectric layer on the upper dielectric liner with the first and second openings in the first and second regions, wherein the metal level dielectric layer serves as a metal level $M_{i+1}$ dielectric;

performing a first etch, wherein the first etch
patterns the metal level dielectric layer, which serves as the metal level $M_{i+1}$ dielectric, to form first and second trenches, and
patterns the dielectric layer, which serves as the via level $V_i$ dielectric, using the upper dielectric liner as an etch mask to form the first and second vias, wherein the first via stops at the dielectric liner and the second via stops at the lower dielectric liner; and
performing a second etch, wherein the second etch
patterns the dielectric liner at the first via to expose the top electrode of the MTJ stack, and the lower dielectric liner at the second via to expose a logic metal line in the metal level $M_L$ dielectric.

12. The method of claim 11 wherein:
etching the metal level dielectric-layer and the dielectric layer comprises a first etch; and
etching the exposed dielectric liner and the exposed first lower dielectric liner comprises a second etch.

13. The method of claim 1 wherein metal lines of metal level $M_L$ are defined based on 1× design rule and metal lines of metal level $M_{i+1}$ are defined based on 2× design rule.

14. The method of claim 1 wherein:
the dielectric liner lines top and sidewalls of the upper MTJ portion and top of the lower MTJ portion.

15. A method for forming a device comprising:
providing a substrate defined with at least first and second regions, the first region comprises a memory region for magnetic random access memories (MRAMs) and the second region comprises a logic region, wherein the substrate is prepared with
front-end-of-line (FEOL) components on the substrate in the first and second regions, and
a lower back-end-of-line (BEOL) dielectric layer disposed over the substrate covering the FEOL components, the lower BEOL dielectric layer comprises
L interconnect dielectric (ILD) level, where L is a whole number greater than or equal to 1 but less than x, where x is the total number of ILD levels for the device, and
wherein an $i^{th}$ ILD level of the device comprises a via level $V_{i-1}$ dielectric below a metal level $M_i$ dielectric, where i is from 1 to x, and the via level dielectric includes contacts and the metal level $M_i$ dielectric includes metal lines;
forming a lower dielectric liner on a metal level $M_L$ dielectric, which is a top of the lower BEOL dielectric layer in the first and second regions;
forming a dielectric layer which serves as a via level $V_i$ above the metal level $M_L$ dielectric, wherein the dielectric layer is prepared with a dielectric liner disposed over a magnetic tunnel junction (MTJ) stack which includes a MTJ between top and bottom electrodes, wherein the bottom electrode of the MTJ stack is electrically coupled to a lower metal line in the metal level $M_L$ dielectric below through an opening in the lower dielectric liner;
forming a metal level dielectric layer over the via level dielectric layer, the metal level dielectric layer serves as a metal level $M_{i+1}$ dielectric;
performing a first etch to form a first dual damascene structure in the first region, wherein the first etch
patterns the metal level $M_{i+1}$ dielectric layer, which serves as the metal level $M_{i+1}$ dielectric, to form a first trench, and patterns the dielectric layer, which serves as the via level $V_i$ dielectric, to form a first via, wherein the first via stops at the dielectric liner; and performing a second etch on the dielectric liner at the first via to expose the top electrode of the MTJ stack.

16. The method of claim 15 wherein the MTJ stack comprises a lower MTJ portion and an upper MTJ portion, wherein the lower MTJ portion is larger than the upper MTJ portion.

17. The method of claim 16 wherein:
layers of the lower MTJ portion comprises
the bottom electrode,
a first fixed layer, and
a first tunneling layer; and
layers of the upper MTJ portion comprises
a free layer, and
the top electrode.

18. A device comprising:
a substrate defined with at least first and second regions, the first region comprises a memory region for magnetic random access memories (MRAMs) and the second region comprises a logic region;
front-end-of-line (FEOL) components provided on the substrate in the first and second regions;
a lower back-end-of-line (BEOL) dielectric layer disposed over the substrate covering the FEOL components, the lower BEOL dielectric layer comprises
L interconnect dielectric (ILD) level, where L is a whole number greater than or equal to 1 but less than x, where x is the total number of ILD levels for the device, and
wherein an $i^{th}$ ILD level of the device comprises a via level $V_{i-1}$ dielectric below a metal level $M_i$ dielectric, where i is from 1 to x, and the via level $V_{i-1}$ dielectric includes contacts and the metal level $M_i$ dielectric includes metal lines;
a lower dielectric liner disposed on a metal level $M_L$ dielectric, which is a top of the lower BEOL dielectric layer in the first and second regions;
a dielectric layer disposed on the substrate in the first and second regions, the dielectric layer includes a lower portion and an upper portion, and wherein the dielectric layer includes a magnetic tunnel junction (MTJ) stack of a MRAM cell disposed on the lower dielectric liner in the first region of the substrate, the MTJ stack includes a MTJ disposed between top and bottom electrodes;

a MTJ dielectric liner disposed over a top surface of the MTJ stack, wherein the MTJ stack with the MTJ dielectric liner is disposed in the lower portion of the dielectric layer, and wherein the upper portion of the dielectric layer is disposed between the top of the MTJ dielectric liner and an upper dielectric liner, the dielectric layer serves as a via level $V_L$ dielectric above the metal level $M_L$ dielectric, and wherein the upper dielectric liner is disposed on the $V_L$ dielectric layer in the first and second regions, wherein the upper dielectric liner includes via openings in the first and second regions;

a metal level dielectric layer disposed on the upper dielectric liner in the first and second regions, wherein the metal level dielectric layer serves as a metal level $M_{L+1}$ dielectric; and first and second via contacts disposed in the $V_L$ dielectric layer in the first and second regions, wherein
the first via contact is disposed in a first via from the top of the $V_L$ dielectric layer to the MTJ stack through the MTJ dielectric liner, the first via contact is coupled to the MTJ stack which is connected to a first $M_L$ metal line, and a first $M_{L+1}$ metal line in the metal level $M_{L+1}$ dielectric, and
the second via contact is disposed in a second via from the top of the $V_L$ dielectric layer to a second $M_L$ metal line in the metal level $M_L$ dielectric through the lower dielectric liner, the second via is a single continuous via, the second via contact is coupled to the second $M_L$ metal line and a second $M_{L+1}$ metal line in the metal level $M_{L+1}$ dielectric.

19. The device of claim 18 wherein the MTJ stack comprises a lower MTJ portion and an upper MTJ portion, wherein the lower MTJ portion has a length that is larger than a length of the upper MTJ portion.

20. The device of claim 19 wherein:
layers of the lower MTJ portion comprises
the bottom electrode,
a first fixed layer, and
a first tunneling layer; and
layers of the upper MTJ portion comprises
a free layer, and
the top electrode.

* * * * *